(12) United States Patent
Bender

(10) Patent No.: US 7,041,588 B2
(45) Date of Patent: May 9, 2006

(54) METHOD FOR PRODUCING SMOOTH INDIUM-TIN-OXIDE LAYERS ON SUBSTRATES AND A SUBSTRATE COATING OF INDIUM-TIN-OXIDE

(75) Inventor: Marcus Bender, Hanau (DE)

(73) Assignee: Applied Films GmbH & Co. KG, Alzenau (DE)

( * ) Notice: Subject to any disclaimer, the term of this patent is extended or adjusted under 35 U.S.C. 154(b) by 34 days.

(21) Appl. No.: 10/871,968

(22) Filed: Jun. 18, 2004

(65) Prior Publication Data

US 2004/0258920 A1    Dec. 23, 2004

(30) Foreign Application Priority Data

Jun. 20, 2003  (DE) ................ 103 27 897

(51) Int. Cl.
*H01L 21/44* (2006.01)

(52) U.S. Cl. ................ 438/608; 438/104; 257/40

(58) Field of Classification Search ................ 438/608, 438/104; 257/40
See application file for complete search history.

(56) References Cited

FOREIGN PATENT DOCUMENTS

| JP | 02189816 A | 7/1990 |
|---|---|---|
| JP | 07078526 A | 3/1995 |

*Primary Examiner*—W. David Coleman
*Assistant Examiner*—Nicholas J. Tobergte
(74) *Attorney, Agent, or Firm*—Van Dyke, Gardner, Linn & Burkhart, LLP

(57) ABSTRACT

In a method for producing ITO layers on substrates, especially for the production of organic light-emitting diodes, part of the ITO layer thickness is applied first by sputter-deposition, at a controlled temperature profile, in such manner that the formation of crystallization nuclei is prevented; subsequently, the partially coated substrate is heated to a temperature above the recrystallization temperature of the ITO layer, and then the rest of the ITO layer is sputter-deposited.

22 Claims, 2 Drawing Sheets

METHOD FOR PRODUCING SMOOTH INDIUM-TIN-OXIDE LAYERS ON SUBSTRATES AND A SUBSTRATE COATING OF INDIUM-TIN-OXIDE

BACKGROUND AND TECHNICAL FIELD OF THE INVENTION

The invention relates to a method for producing smooth metal oxide layers, especially indium tin oxide layers, on substrates that are used in particular for the production of organic light-emitting diodes. The invention relates further to a substrate coating of indium tin oxide.

Organic light-emitting diodes (OLEDs) are generally produced by applying a transparent conducting layer onto a glass substrate and then structuring the conducting layer so that its acts as an electrode. Various layers of organic materials are then deposited on this transparent electrode. These organic layers are very thin, generally on an order of magnitude of 10 nm. To prevent short circuits or other defects that can be caused by spikes or edges on the surface, the transparent electrode must have a very smooth surface. The display is ultimately completed by a counter-electrode, which is generally metallic, and is then encapsulated.

Smooth indium tin oxide layers (referred to in the following as ITO layers) are often deposited by way of an ion-assisted sputtering, or ion plating, process with which smooth layers can be obtained at low temperatures. Among these processes the Skion process, for example, is familiar. However, in addition to a sputter source that acts as a cathode, ion-assisted sputtering needs an ion source; this means a considerable increase in plant costs, which is automatically reflected in the production costs for the manufacture of OLED displays of this kind. The disadvantage of using customary, standard sputtering processes is that they require an additional, mechanical polishing step and thus an additional process step. This likewise increases the production costs for OLED displays of this kind.

Where customary standard sputter sources are used, especially the DC magnetron process, the layers are applied onto substrates at temperatures above the material's recrystallization temperature (approx. 150° C. for ITO) in order to obtain good electrical and optical properties. Usually, the substrate is heated to temperatures of about 200° C. This heating process is carried out because at lower temperatures, the resistivities and transmittances of the indium tin oxide layers do not satisfy the electrical and optical requirements. With such methods, film growth may be microcrystalline, and spikes can form on the film surface. Experiments have shown that ITO layers deposited at a substrate temperature of 200° C. by DC magnetron sputtering have an rms roughness of 2.3 nm and a maximum roughness of 16.1 nm. If one applies the thin organic-material layers required for the production of organic light-emitting diodes onto a layer like this, a mechanical polishing step is necessary in order to avoid short circuits or other defects caused by spikes or edges on the surface. However, this makes the production of organic light-emitting diodes of this kind more complicated and also increases the production costs.

SUMMARY OF THE INVENTION

The object of the invention is to produce smooth metal oxide layers, especially smooth ITO layers, on substrates in a simple and economical manner, in particular using standard sputter sources such as DC magnetron or RF/DC-pulsed magnetron processes (direct-current sputtering or radio-frequency-pulsed direct-current sputtering). This object is established according to the invention for a method by means of the characterizing features of claim 1, and for a substrate coating by means of the features of claim 15.

The invention is based on the consideration that in the case of cold-deposited layers, especially indium tin oxide layers, crystallization nuclei that remain even if the substrate is after-annealed only occur when the layer thickness exceeds 70 nm. According to the invention, therefore, only part of the final metal-oxide-layer thickness is sputter-deposited onto the substrate in a first step, the temperature profile being controlled such that the formation of crystallization nuclei is prevented. Subsequently, the substrate is heated to a temperature above the recrystallization temperature, which is about 150° C. in the case of an ITO layer. Then the remaining ITO-layer thickness is applied by sputter deposition.

DESCRIPTION OF THE PREFERRED EMBODIMENT

It is to advantage if, in a first coating step, the ITO layers are applied with a partial thickness of less than 70 nm; a thickness in the range from 25 nm to 50 nm is particularly preferred. It is expedient here to apply the coating onto a cold substrate, or at least onto a substrate which is below 150° C., i.e. the recrystallization temperature of the indium tin oxide layer. The coating is preferably applied at a substrate temperature of 100° C. or less, in particular in the range from 15° C. to 30° C., that is, best of all at room temperature. The partially-coated substrate is then advantageously heated to a temperature of about 180° C. or more, whereupon the rest of the ITO layer is sputter-deposited.

The invention thus provides for the application of smooth ITO layers using familiar plant technology, i.e. customary standard sputter processes such as the DC magnetron or the RF/DC-pulsed magnetron processes, without the need for an additional downstream process step for smoothing the indium tin oxide layer. In particular, the use of complicated, expensive and difficult-to-control ion-assisted sputtering technology can be avoided. This is achieved by exploiting the temperature-dependent growth kinetics of the indium tin oxide layers.

Figure 1:
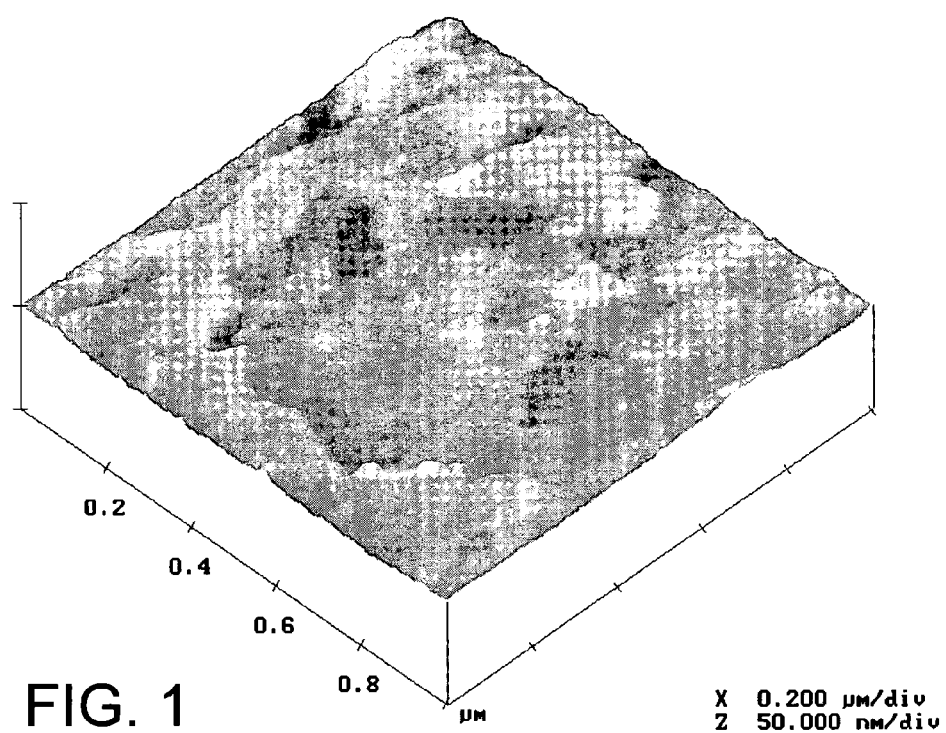
FIG. 1 illustrates an ITO film produced according to the method of the present invention.
Figure 2:
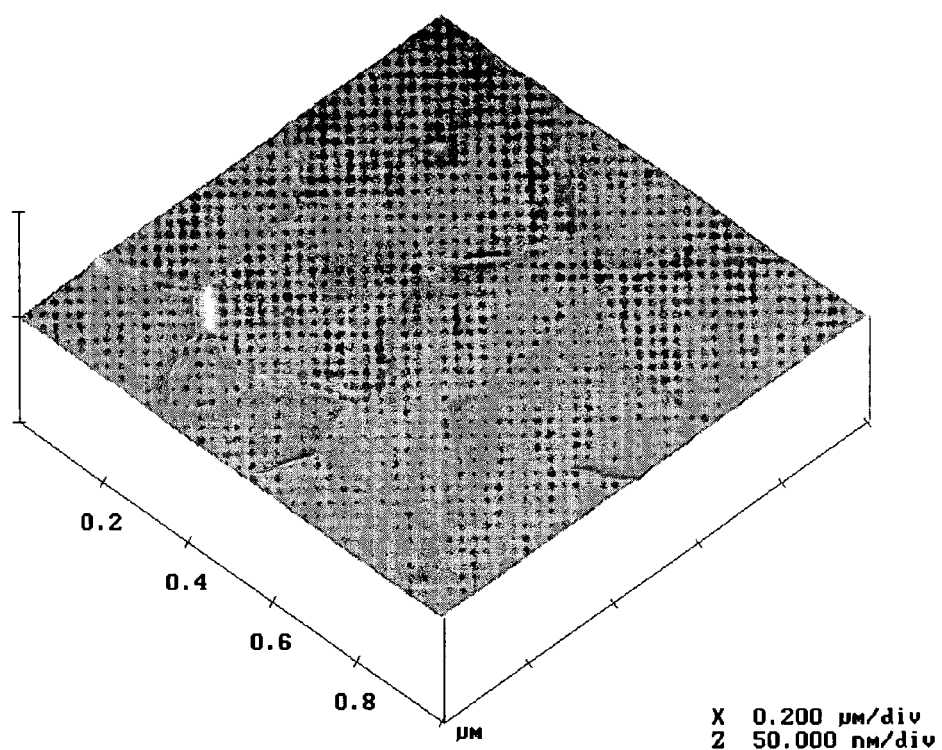
FIG. 2 illustrates another ITO film produced according to the method of the present invention.

The invention will now be explained on the basis of two embodiments and with reference to FIGS. 1 and 2, which illustrate ITO films produced according to the method of the invention.

EXAMPLE 1

A glass substrate is coated with 35 nm ITO at room temperature by means of DC magnetron sputtering, using a power density of 2 W/cm$^2$. After this coating step, the substrate is heated to 200° C. and kept at this temperature while it is coated with a further 105 nm ITO at a power density of 2 W/cm$^2$. The film deposited on the substrate has a total thickness of 140 nm, a resistivity of 200 μΩcm, a transmittance of 85% at a wavelength of 550 nm, an rms roughness of 1.0 nm and a maximum roughness of 10.8 (FIG. 1).

EXAMPLE 2

A glass substrate is coated with 49 nm ITO at room temperature by means of RF/DC-pulsed magnetron sputtering, using a power density of 2.25 W/cm². After this coating step, the substrate is heated to 200° C. and kept at this temperature while it is coated with a further 91 nm ITO at a power density of 2.25 W/cm². The film deposited on the substrate has a total thickness of 140 nm, a resistivity of 200 μΩcm, a transmittance of 88% at a wavelength of 550 nm, an rms roughness of 0.42 nm and a maximum roughness of 4.7 nm (FIG. 2).

Using the method of the invention, it is thus possible to produce low-resistance, transparent, conducting indium tin oxide layers that are characterized by very low surface roughness and accordingly do not require mechanical afterpolishing. In fact, the thin organic-material layers needed for the production of organic light-emitting diodes can be applied without further ado.

The embodiments of the invention in which an exclusive property right or privilege is claimed are defined as follows:

1. A method of producing smooth metal oxide layers, wherein a transparent conducting indium tin oxide (ITO) layer is applied onto a glass substrate to form an electrode, said method comprising:
    sputter-depositing part of the ITO layer at a temperature profile controlled such that the formation of crystallization nuclei is prevented;
    heating the substrate to a temperature above a recrystallization temperature of the ITO layer; and
    sputter-depositing the rest of the ITO layer.

2. A method as recited in claim 1, wherein the thickness of the first sputter-deposited ITO layer is less than 70 nm.

3. A method as recited in claim 2, wherein the thickness of the first sputter-deposited ITO layer is in the range of 25 nm to 50 nm.

4. A method as recited in claim 1, wherein sputtering is effected by a DC magnetron process.

5. A method as recited in claim 1, wherein sputtering is effected by a RF/DC-pulsed magnetron process.

6. A method as recited in claim 1, wherein the first ITO layer is sputter-deposited onto a substrate having a temperature below 150° C.

7. A method as recited in claim 6, wherein the substrate has a temperature below approximately 100° C.

8. A method as recited in claim 1, wherein the step of heating the partially coated substrate heats the substrate to a temperature of at least 150° C.

9. A method as recited in claim 8, wherein the substrate is heated to a temperature of at least 180° C.

10. A method as recited in claim 2, wherein the first ITO layer is sputter-deposited onto a substrate having a temperature below 150° C.

11. A method as recited in claim 10, wherein the step of heating the partially coated substrate heats the substrate to a temperature of at least 150° C.

12. A method as recited in claim 3, wherein the first ITO layer is sputter-deposited onto a substrate having a temperature below approximately 100° C.

13. A method as recited in claim 12, wherein the step of heating the partially coated substrate heats the substrate to a temperature of at least 180° C.

14. A method as recited in claim 1, wherein said method is used for the production of light-emitting diodes.

15. A substrate coating of indium tin oxide (ITO), said substrate coating comprising a first ITO layer having a thickness of less than 70 nm, and a second ITO layer applied on top of said first ITO layer, wherein said first ITO layer is crystallization free, and wherein said substrate coating is formed by a method comprising:
    sputter-depositing said first ITO layer onto a substrate at a temperature profile controlled such that the formation of crystallization nuclei is prevented;
    heating the substrate to a temperature above a recrystallization temperature of the ITO layer; and
    sputter-depositing said second ITO layer on top of said first ITO layer.

16. The substrate coating of indium tin oxide according to claim 15, wherein the first ITO layer is sputter-deposited onto a substrate having a temperature below 150° C.

17. The substrate coating of indium tin oxide according to claim 16, wherein the step of heating the partially coated substrate heats the substrate to a temperature of at least 150° C.

18. The substrate coating of indium tin oxide according to claim 15, wherein said substrate coating is used in the production of light-emitting diodes.

19. An organic light-emitting diode having a smooth indium tin oxide layer, wherein said smooth indium tin oxide layer is formed by a method comprising:
    sputter-depositing a first ITO layer onto a substrate at a temperature profile controlled such that the formation of crystallization nuclei is prevented;
    heating the substrate to a temperature above a recrystallization temperature of the ITO layer; and
    sputter-depositing a second ITO layer on top of the first ITO layer.

20. The organic light-emitting diode of claim 19, wherein the thickness of the first ITO layer is less than 70 nm.

21. The organic light-emitting diode of claim 20, wherein the first ITO layer is sputter-deposited onto a substrate having a temperature below 150° C.

22. The organic light-emitting diode of claim 21, wherein the step of heating the partially coated substrate heats the substrate to a temperature of at least 150° C.

* * * * *